United States Patent [19]

Kim et al.

[11] Patent Number: 4,987,462
[45] Date of Patent: Jan. 22, 1991

[54] POWER MISFET

[75] Inventors: Bumman Kim, Richardson; Hua Q. Tserng, Dallas, both of Tex.

[73] Assignee: Texas Instruments Incorporated, Dallas, Tex.

[21] Appl. No.: 706

[22] Filed: Jan. 6, 1987

[51] Int. Cl.[5] .................. H01L 29/80; H01L 29/161
[52] U.S. Cl. ........................................ 357/22; 357/16; 357/90
[58] Field of Search ............... 357/16, 22 A, 22 I, 357/22 J, 22 K, 90, 22 MD

[56] References Cited

U.S. PATENT DOCUMENTS

| | | | |
|---|---|---|---|
| 4,194,935 | 3/1980 | Dingle et al. | 357/90 |
| 4,558,337 | 12/1985 | Saunier et al. | 357/22 A |
| 4,652,896 | 3/1987 | Das et al. | 357/22 A |

FOREIGN PATENT DOCUMENTS

| | | | |
|---|---|---|---|
| 59-31072 | 2/1984 | Japan | 357/22 MD |
| 59-222966 | 12/1984 | Japan | 357/22 MD |
| 60-144979 | 7/1985 | Japan | 357/22 MD |

OTHER PUBLICATIONS

S. Judaprawira et al., "Mod.-Doped MBE GaAs/-n-$Al_xGa_{1-x}As$ MESFETs," IEEE Elec. Dev. Lett., vol. EDL-2, #1, Jan. 1981, pp. 14, 15.

J. Barnard et al., "Double Heterostructure $GA_{0.47}In_{0.53}As$ MESFETs with Submicron Gates", IEEE Electron Device Letters, vol. EDL-1, No. 9, Sep. 1980.

Primary Examiner—Rolf Hille
Assistant Examiner—Wael Fahmy
Attorney, Agent, or Firm—Jim Comfort; Melvin Sharp; Douglas A. Sorensen

[57] ABSTRACT

Preferred embodiments include a microwave power MISFET (30) with a thin GaAS channel (54) bounded by an undoped $Al_xGa_{1-x}As$ gate insulator (44) and a doped $Al_yGa_{1-y}As$ barrier (40). Under forward bias the channel (54) forms a quantum well which accumulates electrons and thereby increase maximum current and power handling without degrading breakdown voltage of the heterostructure MISFET An additional active layer (36) can be included on the other side of the barrier (40) to further increase power handling. Other embodiments include use of a strained layer $In_zGa_{1-z}As$ channel.

9 Claims, 8 Drawing Sheets

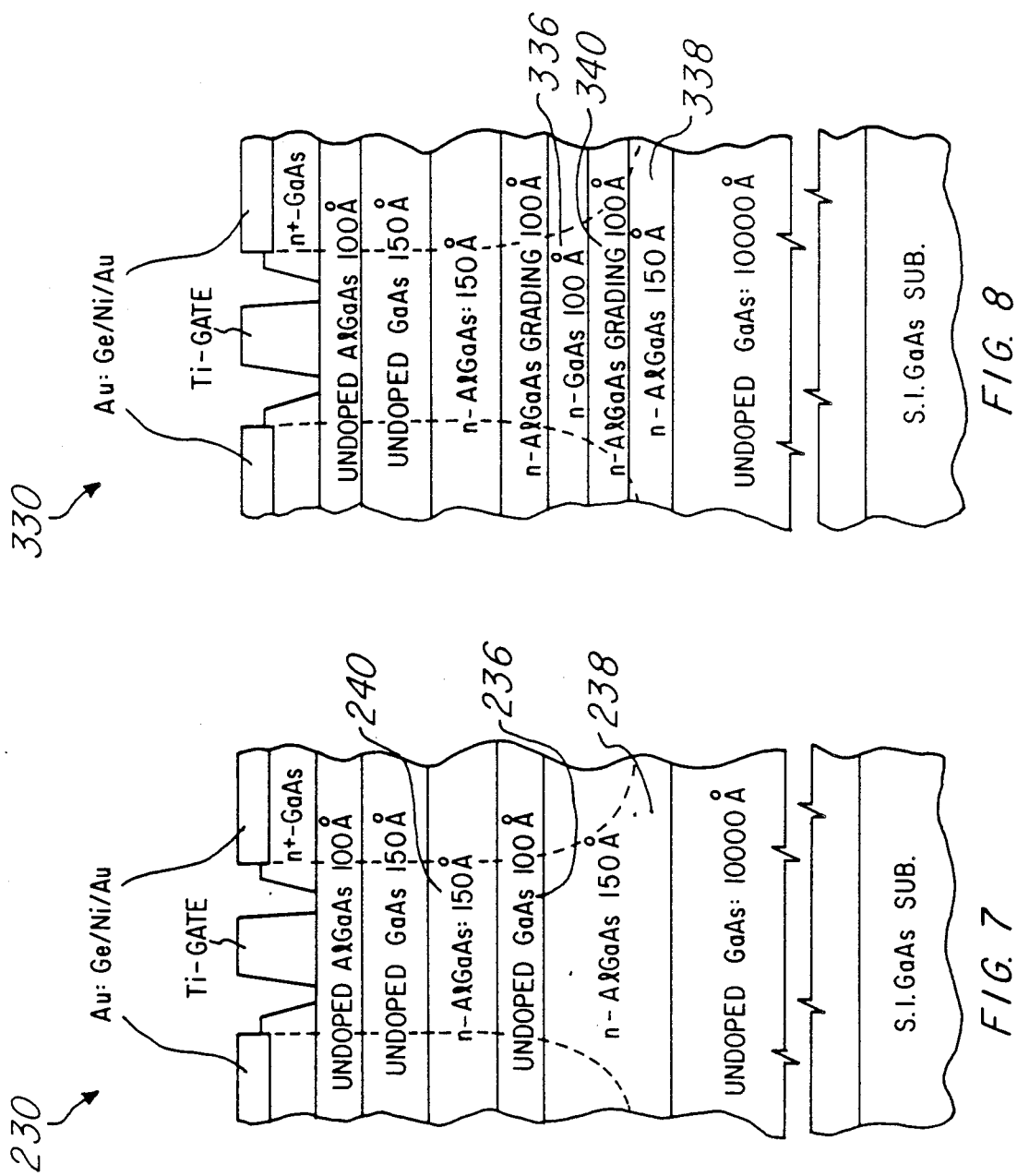

POWER MISFET

BACKGROUND OF THE INVENTION

1. Field of the Invention

The present invention relates to electronic semiconductor devices, and, more particularly, to high frequency field effect power transistors.

2. Description of the Related Art

Microwave power transistors typically are metal semiconductor field effect transistors (MESFETs) with recessed gates and n type gallium arsenide (GaAs) semiconductor channels. A recessed gate lengthens the surface leakage path from gate to drain and permits the channel electrons to be slightly removed from the surface and attendant surface state scattering. The cut-off frequency ($f_t$) of conventional GaAs MESFETs depends on the gate length roughly as $$f_t = \frac{G_{m0}}{2\pi C_{gs}} \approx \frac{\bar{v}}{2\pi L} = \frac{1}{2\pi \tau}$$

where $G_{m0}$ is the intrinsic transconductance, $C_{gs}$ is the gate-source capacitance, $\bar{v}$ is the average carrier drift velocity in the channel, $L$ is the effective channel length (gate length), and $\tau$ is the average transit time for a carrier traversing the channel. Thus reducing gate length increases $f_t$, and millimeter-wave GaAs MESFETs for 60 GHz operation typically have 0.25 μm long gates. But to limit short channel effects, the channel thickness (usually denoted by a) must be much less than one third of the gate length (i.e., $L >> 3a$); see H. Daembkes et al, Improved Short-Channel GaAs MESFET's by Use of Higher Doping Concentration, 31 IEEE Tr.Elec.Dev. 1032 (1984). Thus, the channel thickness is decreased with decreasing gate length. However, device power depends upon the channel current, so the doping concentration in the channel must be increased to compensate for the thinner channel. However, the resultant high doping concentrations lower the breakdown voltage ($V_b$) and power density per unit gate width. And because of the nonuniform field distribution in the channel, the breakdown voltage is also proportional to the total charge in the depletion layer under the gate at pinch-off; see W. Frensley, Power-Limiting Breakdown Effects in GaAs MESFET's, 28 IEEE Tr.Elec.Dev. 962 (1982) which demonstrates a good approximation for the breakdown voltage is:

$$V_b = \frac{4.4 \times 10^{13} V/cm^2}{\int N(y) dy}$$

where $N(y)$ is the doping density as a function of depth in the channel and the integration is over the channel thickness. But total charge in the depletion layer at pinch-off is proportional to the maximum current (presuming no charge accumulation):

$$\int N(y) dy \approx I_{max}.$$

Thus $I_{max}$ is inversely proportional to $V_b$:

$$V_b = \frac{Constant}{I_{max}}$$

and the output power per unit gate width of a MESFET is:

$$P_{out} = \frac{1}{2} \times \frac{V_b}{2} \times \frac{I_{max}}{2} = \frac{1}{8} \times Constant$$

Therefore, the power of a standard MESFET is limited by the relationship between $V_b$ and $I_{max}$.

The output power of GaAs FETs can be improved by using insulated gates to increase either $V_b$ or $I_{max}$ without decreasing the other. Such metal insulator semiconductor FETs are called MISFETs. Breakdown occurs at the drain-side edge of the gate where the electric field is greatest and involves avalanche multiplication, and for MISFETs the breakdown voltage in this region is very high due to the wide bandgap of the insulator. However, fabrication of MISFETs from GaAs and other III-V compound semiconductors has proved difficult due to the large interface state densities at the insulator-channel interface; see, for example, T. Mimura et al, GaAs Microwave MOSFET's, 25 IEEE Tr.Elec.Dev. 573 (1978) which grows native oxides on GaAs to form MOSFETs; and B. Pruniaux et al, A Semi-Insulated Gate Gallium-Arsenide Field-Effect Transistor, 19 IEEE Tr.Elec.Dev. 672 (1972) which ion implants argon into GaAs to form a semi-insulating layer to act as a gate insulator. These approaches have not been fruitful.

A different approach to III-V MISFETs appears in J. Baranrd et al, Double Heterostructure $Ga_{0.47}In_{0.53}As$ MESFETs with Submicron Gates, 1 IEEE Elec.Dev.-Lett. 174 (1980) which uses an undoped AlInAs gate "insulator" on an n type GaInAs channel together with an undoped AlInAs barrier under the channel to confine electrons to the channel. The AlInAs insulator forms a lattice-matched heterojunction with the GaInAs channel and consequently has low interface state densities; but this device has insufficient power handling and the donors in the GaInAs channel scatter the conduction electrons. Also see B. Kim et al, Microwave Power GaAs MISFET's with Undoped AlGaAs as An Insulator, 5 IEEE Elec.Dev.Lett. 494 (1984) which uses an undoped $Al_xGa_{1-x}As$ gate insulator on a GaAs channel doped n type to a carrier concentration of about $3.5 \times 10^{17}/cm^3$.

Another approach is the high electron mobility transistor (HEMT) or modulation doped field effect transistor (MODFET) which typically has an n type $Al_xGa_{1-x}As$ gate insulator layer epitaxially grown on and forming a heterojunction with an undoped GaAs channel; the donated electrons migrate from the $Al_xGa_{1-x}As$ into the GaAs due to the conduction band discontinuity and form a two-dimensional electron gas (2DEG) at the interface. The 2DEG provides very high mobility electrons but little power handling capability due to low current levels and a low breakdown voltage of n type $Al_xGa_{1-x}As$. Donors in the $Al_xGa_{1-x}As$ gate insulator screen the gate voltage, and forward bias leads to parallel conduction in the gate insulator and low transconductance. Enhancements such as two n type $Al_xGa_{1-x}As$ layers, one on either side of the undoped GaAs channel, to provide two interfaces each with a 2DEG do not solve the problems; see S. Judaprawira et al, Modulation-doped MBE GaAs/$nAl_xGa_{1-x}As$ MESFETs, 2 IEEE Elec.Dev.Lett. 14 (1981). Similarly, Delagebeaudeuf et al, U.S. Pat. No. 4,455,564, combines a MESFET with a HEMT to have a metal gate on a thin heavily doped GaAs channel which is on a thin undoped GaAs second channel which in turn is on a heavily doped $Al_xGa_{1-x}As$ layer to form a 2DEG in the second channel does not solve the problems. And the heterostructure insulated gate field effect transistor (HIGFET), which has a gate on an undoped $Al_xGa_{1-x}As$ insulator which is on an undoped GaAs channel and relies on gate bias to induce a 2DEG, does not have high power handling capability and is typically a lower power, digital device; see N. Cirillo et al, Complementary Heterostructure Insulated Gate Field Effect Transistors (HIGFETs), 1985 IEEE IEDM Digest. p. 317.

Thus there is a problem to provide a FET structure with high power handling capablities, high breakdown voltage, and high transconductance at microwave frequencies.

SUMMARY OF THE INVENTION

The present invention provides heterojunction MISFETs which can accumulate charge in the channel under forward bias by use of a second doped heterojunction barrier bounding the channel opposite the insulator. In preferred embodiments the channel is undoped GaAs or InGaAs, the insulator is undoped $Al_xGa_{1-x}As$, and the heterojunction barrier is n type $Al_yGa_{1-y}As$. The gate length and channel thickness may be adjusted to determine cutoff frequency. The breakdown voltage is not decreased by such accumulation of carriers under forward bias because breakdown relates to reverse bias depletion layer avalanche multiplication, but the maximum current is increased by the accumulated carriers. Additional maximum current is provided by a GaAs active layer opposite the doped $Al_xGa_{1-x}As$ barrier to form a second parallel channel. A part of this active layer may be doped to provide further power handling.

The accumulation of channel carriers under forward bias solves the problem of limited power handling in microwave FETs by increasing the maximum current without degrading the reverse bias breakdown voltage of a MISFET.

BRIEF DESCRIPTION OF THE DRAWINGS

The drawings are schematic for clarity.

FIGS. 7-8 are cross sectional elevation views of fifth and sixth preferred embodiment MISFETs.

DESCRIPTION OF THE PREFERRED EMBODIMENTS

Figure 1:
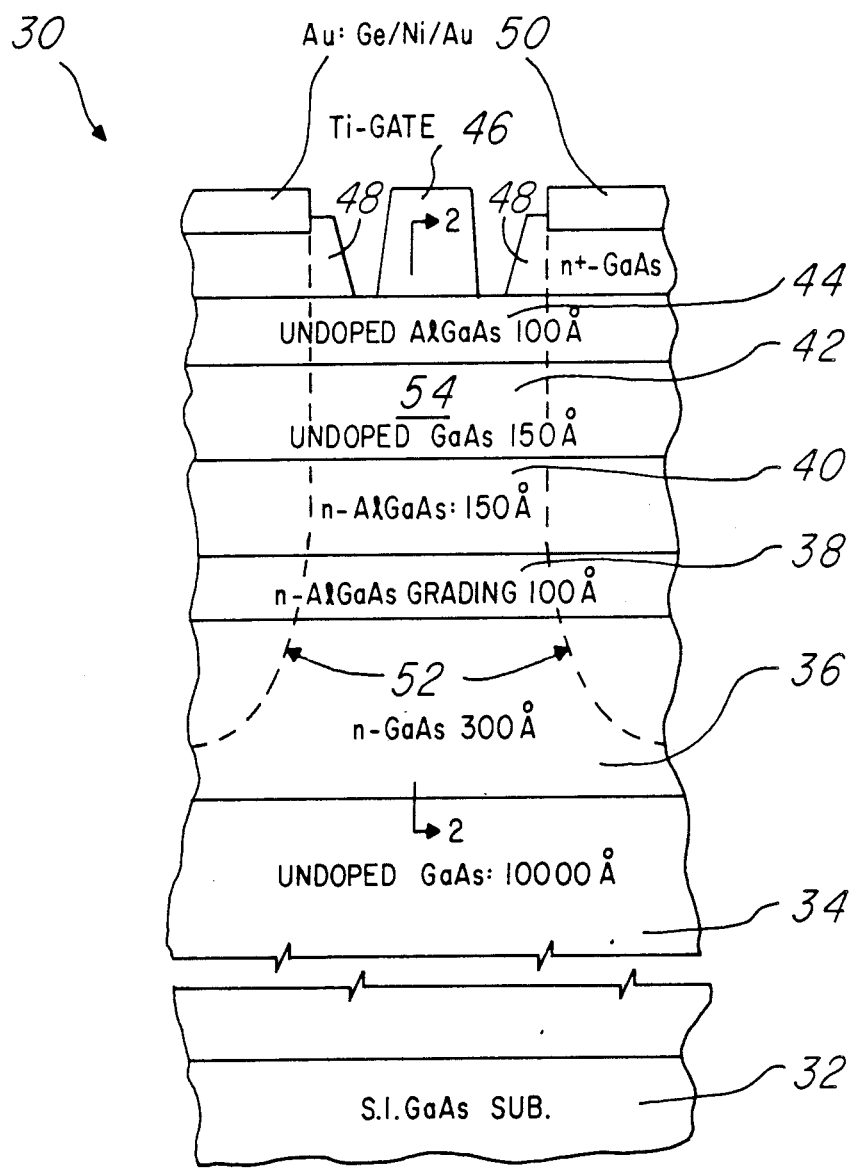
FIG. 1 is a cross sectional elevation view of a first preferred embodiment MISFET.

FIG. 1 is a schematic cross sectional elevation view of a first preferred embodiment MISFET, generally denoted by reference numeral 30, which includes semi-insulating GaAs substrate 32, 1 μm thick undoped GaAs buffer layer 34, 300 Å thick n type GaAs active layer 36, 100 Å thick n type $Al_xGa_{1-x}As$ layer 38 which is compositionally graded from GaAs to $Al_{0.25}Ga_{0.75}As$, 150 Å thick n type $Al_{0.25}Ga_{0.75}As$ barrier layer 40, 150 Å thick undoped GaAs channel layer 42, 100 Å thick undoped $Al_{0.5}Ga_{0.5}As$ insulator layer 44, 0.25 μm long titanium gate 46, 150 Å thick n+ type GaAs source and drain contacts 48, gold:germanium/nickel/gold ohmic source and drain contacts 50, and n+ doped source and drain regions 52 extending through layers 36, 38, 40, 42, 44, and 48; regions 52 are indicated by the broken lines. Channel 54 is the portion of channel layer 42 between the doped regions 52 and is about 1.0 μm long.

Figure 2:
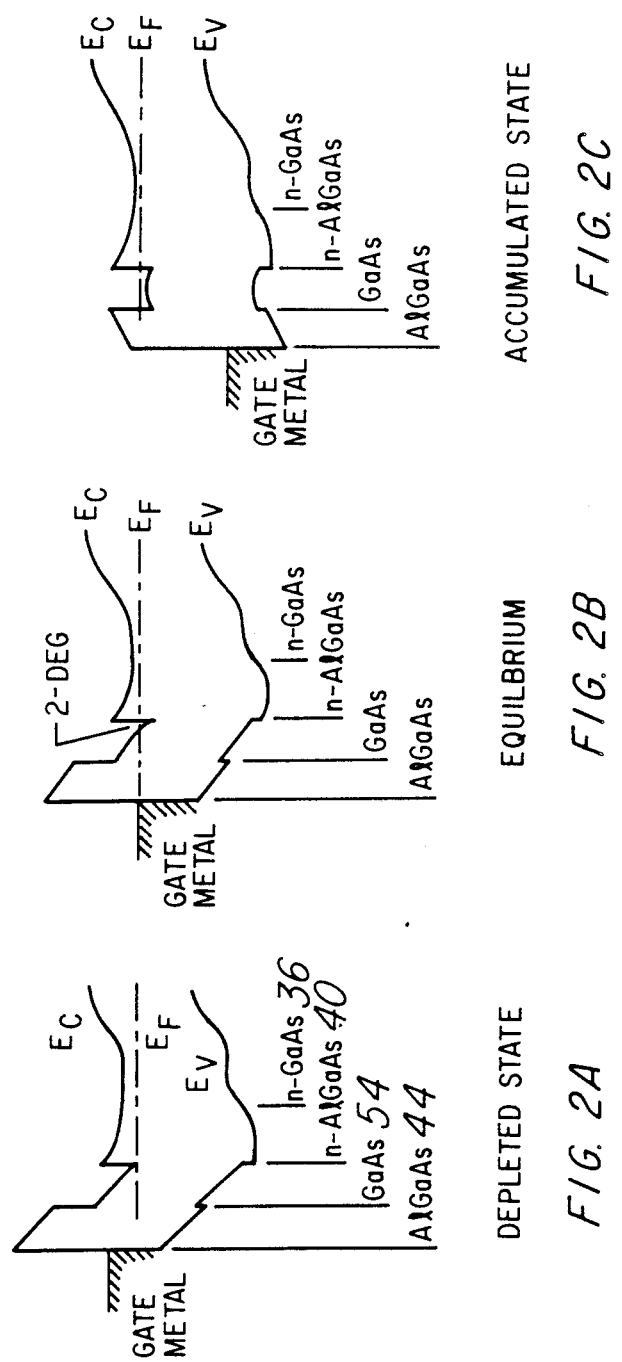
FIGS. 2A-C illustrate the conduction and valence bands for the first preferred embodiment under various bias conditions.

The operation of MISFET 30 can be understood by consideration of the band diagrams of FIGS. 2A-C illustrating the conduction and valence band edges along line 2—2 of FIG. 1 in the depletion, equilibrium, and accumulation states, respectively, which correspond to reverse, zero, and forward biases on gate 46, respectively. Note that if insulator layer 44 were doped, then it would screen gate 46 and limit control by gate 46 of the electron density in channel 54 and active layer 36, and at forward bias parallel conduction through the insulator layer could occur due to the curvature of the band edges. Insulator layer 44 and barrier layer 40 may be different materials provided that each has wider bandgap than the channel layer 42 material, and channel layer 42 and active layer 36 may be different materials provided that each has a narrower bandgap than the barrier layer 40 material.

As illustrated in FIG. 2B, at zero gate bias a two dimensional electron gas (2DEG) forms in GaAs channel 54 at the interface with $Al_{0.25}Ga_{0.75}As$ barrier layer 40; the electrons for the 2DEG are provided by donors in layer 40 and diffuse into and are trapped in channel 54 due to the conduction band discontinuity. Also active layer 36 has a significant electron density due to the high doping (above $3 \times 10^{17}/cm^3$) and little depletion.

A negative (reverse) gate bias of about $-1.5$ V depletes channel 54 and the 2DEG disappears; see FIG. 2A. Both the undoped insulator layer 44 and the undoped channel 54 act as insulators during reverse bias, and the breakdown voltage $V_b$ is thus high. This reverse bias also effectively depletes active layer 36.

Conversely, a forward gate bias of above about $+1.0$ V leads to accumulation of electrons in the quantum well formed by channel 54 between the two heterojunctions with insulator 44 and barrier 40; note that a significant portion of these accumulating electrons come from the source and drain regions 52. An explicit calculation for the second and third preferred embodiments, infra, will clarify this accumulation effect. Active layer 36 is only slightly depleted at this forward bias; see FIG. 2C. This accumulation at forward bias yields a high maximum current $I_{max}$.

Further features of MISFET 30 are apparent from the following first preferred embodiment method of fabrication:

(a) Begin with a semi-insulating single crystal GaAs substrate 32 with a planar surface having crystal orientation (100). On the surface grow by molecular beam epitaxy (MBE) successive epitaxial layers of 10,000 Å of undoped GaAs 34, 300 Å of silicon doped GaAs 36 (dopant concentration of $1 \times 10^{18}/cm^3$), 100 Å of silicon doped $Al_xGa_{1-x}As$ 38 with x varying linearly from 0.0 to 0.25 (dopant concentration about $1 \times 10^{18}/cm^3$), 150 Å of silicon doped $Al_{0.25}Ga_{0.75}As$ 40 (dopant concentration about $1 \times 10^{18}/cm^3$), 150 Å of undoped GaAs 42, 100 Å of undoped $Al_{0.5}Ga_{0.5}As$ 44, and 150 Å of silicon doped GaAs 48 (dopant concentration about $1\times10^{18}/cm^3$).

(b) Spin photoresist onto the layered structure from step (a), and pattern source and drain areas 300 μm wide, μm long, and separated by 1.0 μm. Use the pattern photoresist as an etch mask and etch contact layer 48 to form source and drain mesas; note that $H_2O_2+NH_4OH$ or plasma $CCl_2F_2$ selectively etch GaAs with respect to $Al_xGa_{1-x}As$. Ash the patterned photoresist.

(c) Spin a second photoresist onto the mesa structure from step (b), and pattern openings on the mesas. Use the patterned photoresist as an implant mask and implant silicon (dose about $1\times10^{12}/cm^2$) to form n+ regions 52 extending through layers 48, 44, 42, 40, and 38 into layer 36 (a total distance of about 700 Å). Then use the same patterned photoresist to deposit gold:germanium/nickel/gold ohmic contacts 50 by liftoff.

(d) Spin on PMMA and pattern a 1 μm long and 300 μm wide opening between the source and drain mesas 48 by electron beam. Use the patterned PMMA to deposit titanium gate 46 by liftoff. Lastly, alloy the ohmic contacts.

Figure 3:
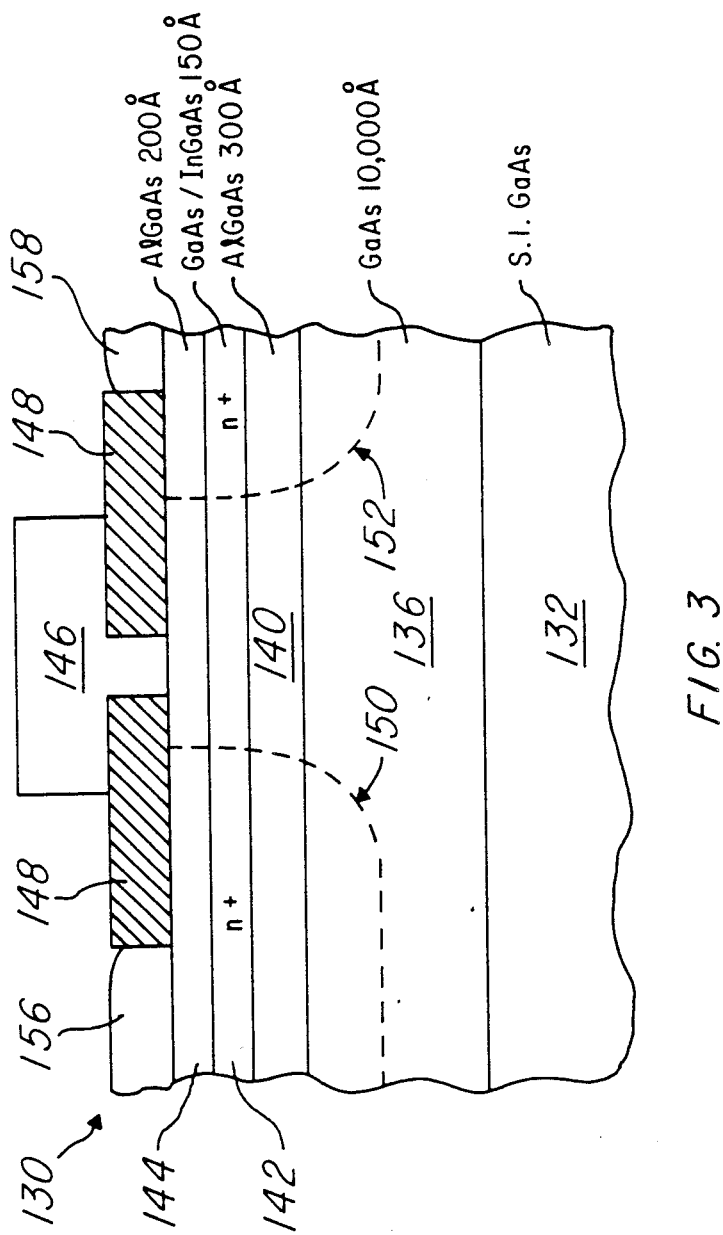
FIG. 3 is a cross sectional elevation view of second and third preferred embodiment MISFETs.

Second and third preferred embodiment MISFETs are variants of MISFET 130 shown in cross sectional elevation view in FIG. 3 and include semi-insulating GaAs substrate 132, 10,000 Å thick undoped GaAs active layer 136, 300 Å thick $Al_{0.25}Ga_{0.75}As$ barrier layer 140 which is doped n type to a donor density of $1.5\times10^{18}/cm^3$, 150 Å thick undoped channel layer 142 which is GaAs in the second preferred embodiment and $In_{0.25}Ga_{0.75}As$ in the third preferred embodiment, 200 Å thick undoped $Al_{0.5}Ga_{0.5}As$ gate insulator layer 144, titanium/platinum/gold gate 146, silicon dioxide dielectric 148, n+ source region 150, n+ drain region 152, and germanium:gold/nickel/gold source ohmic contact 156 and drain ohmic contact 158. Source region 150 and drain region 152 are formed by implanting silicon into layers 136, 140, 142, and 144 (a total distance of about 800 Å). Note that gate 146 is offset towards source 150 to minimize gate-to-drain capacitance and is "T" shaped to lower gate resistance, and that $In_{0.25}Ga_{0.75}As$ 142 forms a strained layer quantum well between barrier layer 140 and gate insulator layer 144.

Figure 4A:
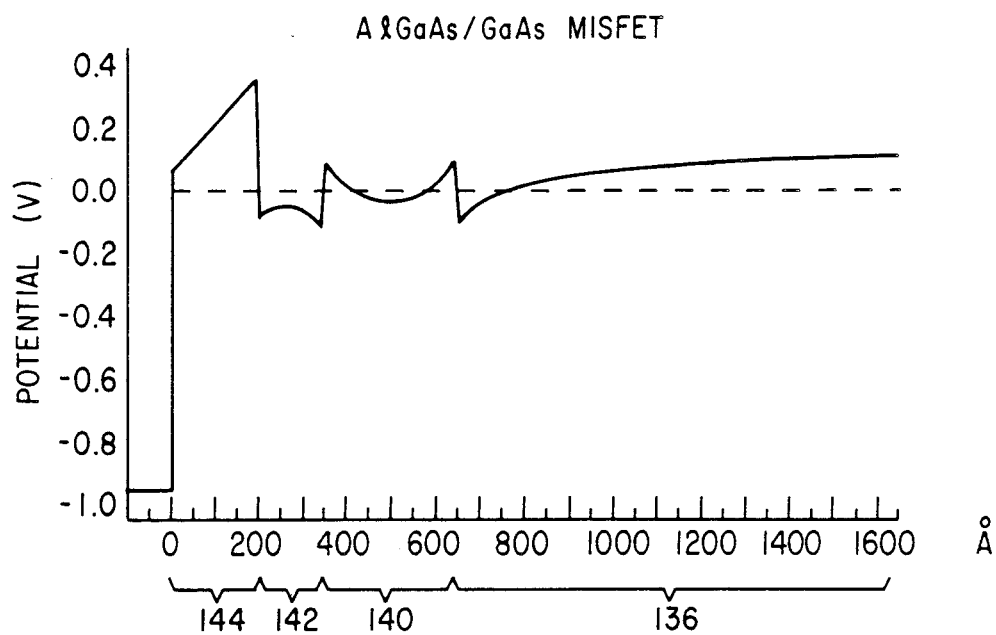
FIGS. 4A-D illustrate the conduction band and electron densities for second and third preferred embodiment MISFETs.
Figure 4B:
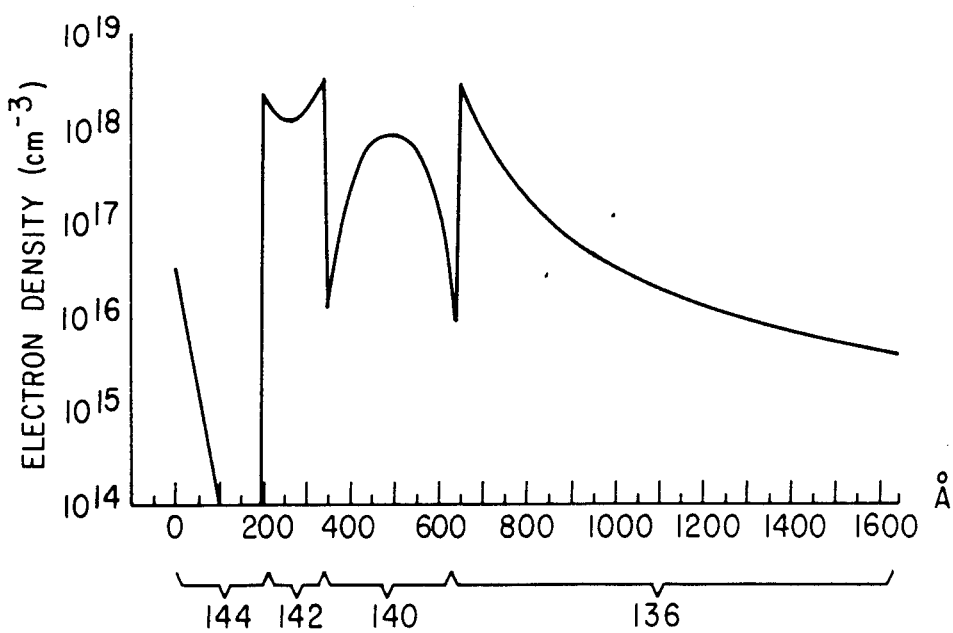

FIGS. 4A-D show the calculated conduction band edge and electron density (in terms of electrons per square cm as viewed from a direction perpendicular to the plane of the layers) of MISFET 130 with a forward bias of 0.95 volt in addition to a presumed built-in Schottky barrier of 1.0 volt. These are static Fermi screening calculations for 300° K. With the second preferred embodiment (GaAs channel) FIG. 4A illustrates the conduction band edge and FIG. 4B illustrates the corresponding electron density. The electron density averaged over each layer is as follows:

| Layer | Electron density ($10^{12}/cm^2$) |
|---|---|
| AlGaAs 144 | nil |
| GaAs 142 | 2.67 |
| AlGaAs 140 | 1.26 |
| GaAs 136 | 1.61 |
| Total | 5.54 |

Note that the doping of $Al_{0.25}Ga_{0.75}As$ barrier layer 140 at $1.5\times10^{18}/cm^3$ translates to a density of $4.5\times10^{12}/cm^2$ for the 300 Å thick layer. Hence, the total electron density ($5.54\times10^{12}/cm^2$) under 0.95 volt forward bias shows a 23% increase over the original doping density (which was all in the AlGaAs barrier layer 140), and even higher density can be achieved by higher forward bias through the insulator layer.

Figure 4C:
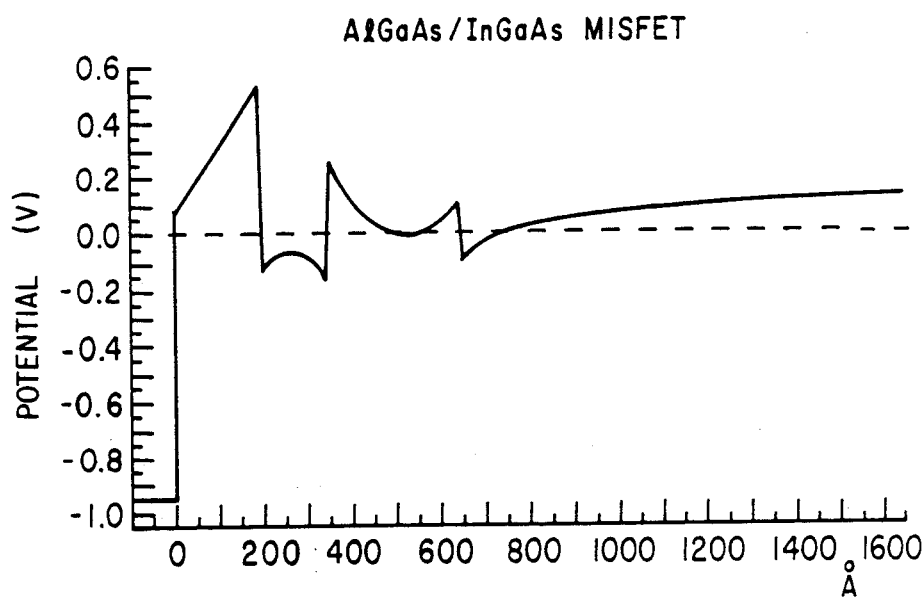
Figure 4D:
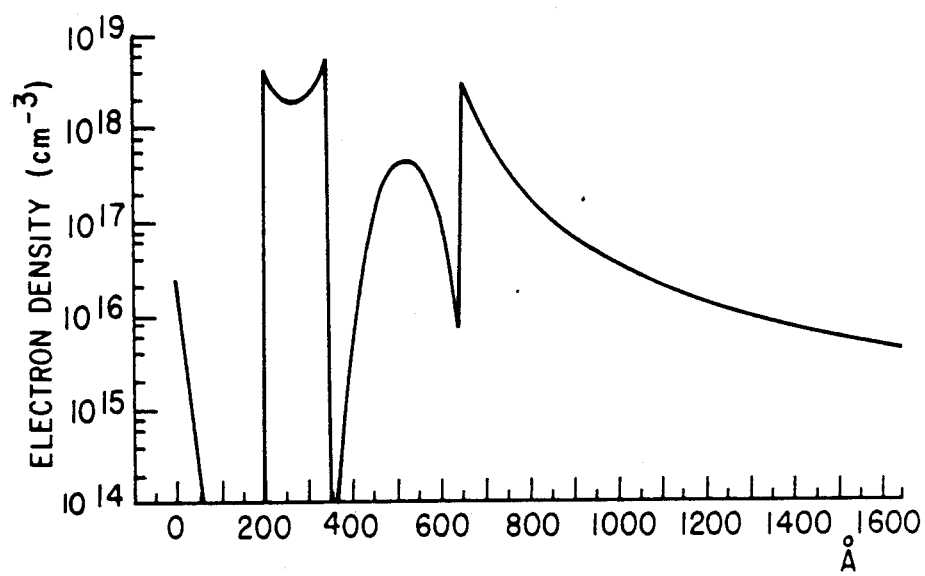

Third preferred embodiment MISFET 130 (InGaAs channel) has similar results; see FIGS. 4C and D for the conduction band edge and electron density with a forward gate bias of 0.95 volts. The electron density averaged over each layer is as follows:

| Layer | Electron density ($10^{12}/cm^2$) |
|---|---|
| AlGaAs 144 | nil |
| InGaAs 142 | 4.13 |
| AlGaAs 140 | 0.50 |
| GaAs 136 | 1.55 |
| Total | 6.18 |

This accumulation at 0.95 volt forward bias is a 37% increase over the original doping of AlGaAs barrier layer 140. Also, a greater fraction of the electrons are in channel 142 in the third preferred embodiment than in the second preferred embodiment: this is due to the greater heterojunction conduction band discontinuity with InGaAs than with GaAs which yields a deeper quantum well. Hence, using $Al_xGa_{1-x}As$ with $x>0.25$ for barrier 140 would further improve the fraction of electrons in channel 142, but heavily doping $Al_xGa_{1-x}As$ is difficult for $x>0.25$.

A comparison with the typical doped channel microwave MESFET may be made by noting a channel thickness of 600 Å and doping concentration of $5\times10^{17}/cm^3$ (typical for 0.25 μm long gate MESFET) yields a total charge density at forward bias (no depletion) of $3.0\times10^{12}/cm^2$. Thus the accumulation in channel 142 provides high total charge for a large $I_{max}$ but without donor ions for scattering.

Figure 5:
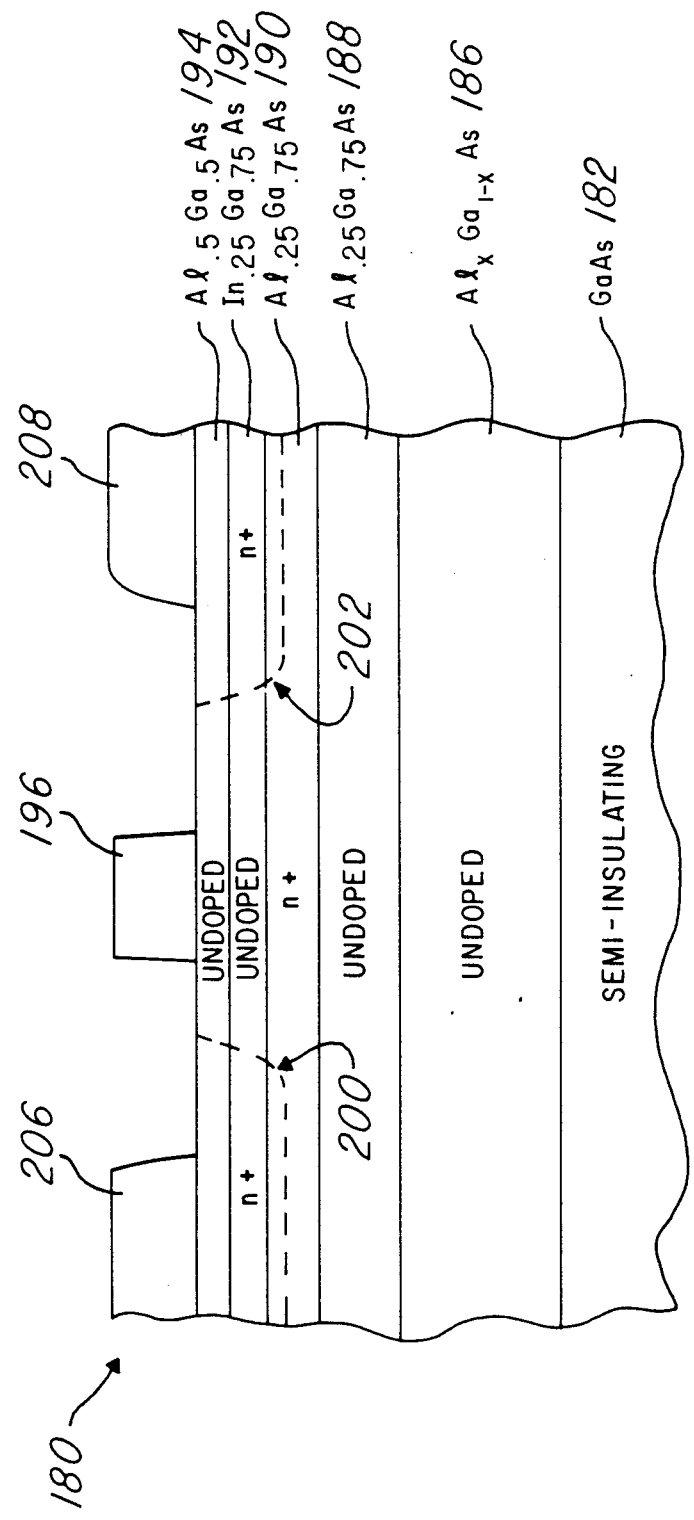
FIG. 5 is a cross sectional elevation view of fourth preferred embodiment MISFET.

A fourth preferred embodiment MISFET 180, illustrated in schematic cross sectional elevation view in FIG. 5, includes semi-insulating GaAs substrate 182, 10,000 Å thick undoped $Al_xGa_{1-x}As$ layer 186 which is graded from x=0 to x=0.25, 1,000 Å thick $Al_{0.25}Ga_{0.75}As$ layer 188 which is undoped, 50 Å thick $Al_{0.25}Ga_{0.75}As$ barrier layer 190 which is doped n type to a donor density of $3.0\times10^{18}/cm^3$, 150 Å undoped $In_{0.25}Ga_{0.75}As$ channel layer 192, 200 Å thick undoped $Al_{0.5}Ga_{0.5}As$ gate insulator layer 194, titanium/platinum/gold gate 196, n+ source region 200, n+ drain region 202, and germanium:gold/nickel/gold source ohmic contact 206 and drain ohmic contact 208. Source region 200 and drain region 202 are formed by implanting silicon into layers 190, 192, and 194 (a total distance of about 400 Å). $In_{0.25}Ga_{0.75}As$ channel 192 forms a strained layer quantum well between barrier layer 190 and gate insulator layer 194.

Figure 6A:
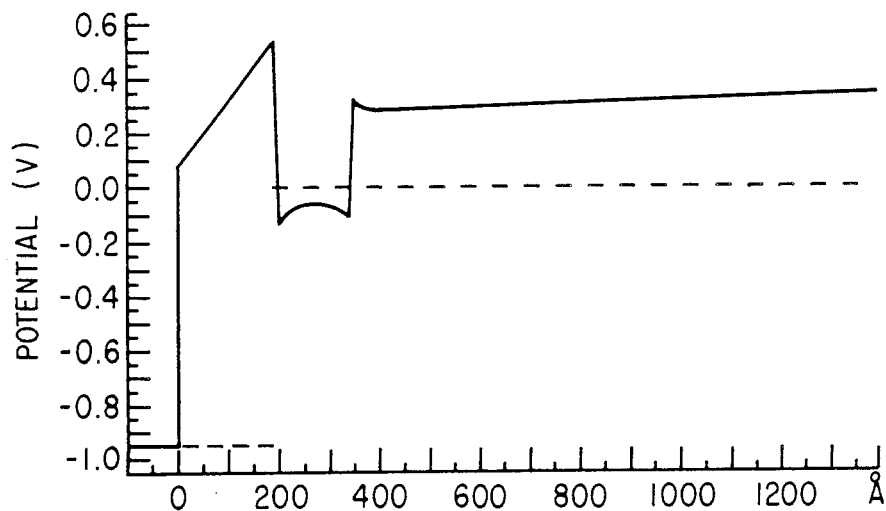
FIGS. 6A-F illustrate the conduction band edge and electron density for the fourth preferred embodiment MISFET.
Figure 6B:
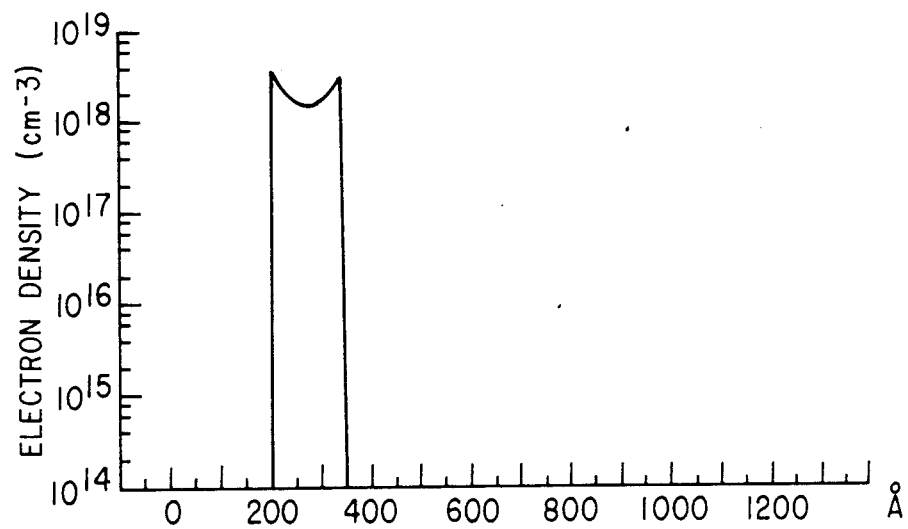

FIGS. 6A-F show the 300° K. static Fermi screening calculated conduction band edge and electron density (in terms of electrons per square cm as viewed from a direction perpendicular to the plane of the layers) of MISFET 180 with a forward bias of 0.95 volt, no bias, and a (reverse) bias of −1.0 volt (all biases are in addition to a presumed built-in Schottky barrier of 1.0 volt). As is apparent from the Figures, MISFET 180 conducts only in channel 192 (no additional active layer analogous to layer 36 of MISFET 30 or layer 136 of MISFET 130) and has a channel and gate insulator similar to those of the third preferred embodiment MISFET 130 but with a narrower doped barrier (and fewer total dopants). In particular, FIGS. 6A-B illustrate the conduction band edge and electron density for a forward bias of 0.95 volt; the electron density averaged over each layer is as follows:

| Layer | Electron density ($10^{12}/cm^2$) |
|---|---|
| AlGaAs 194 | nil |
| InGaAs 192 | 3.18 |
| AlGaAs 190 | nil |
| AlGaAs 188 | nil |
| Total | 3.18 |

This accumulation is a 112% increase over the original doping of AlGaAs barrier 190 (the original doping was $1.5 \times 10^{12}/cm^2$).

Figure 6C:
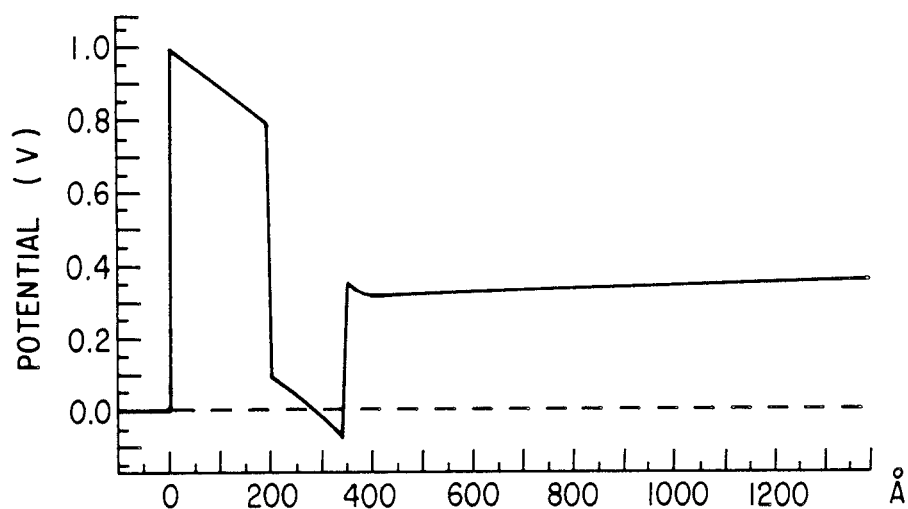
Figure 6D:
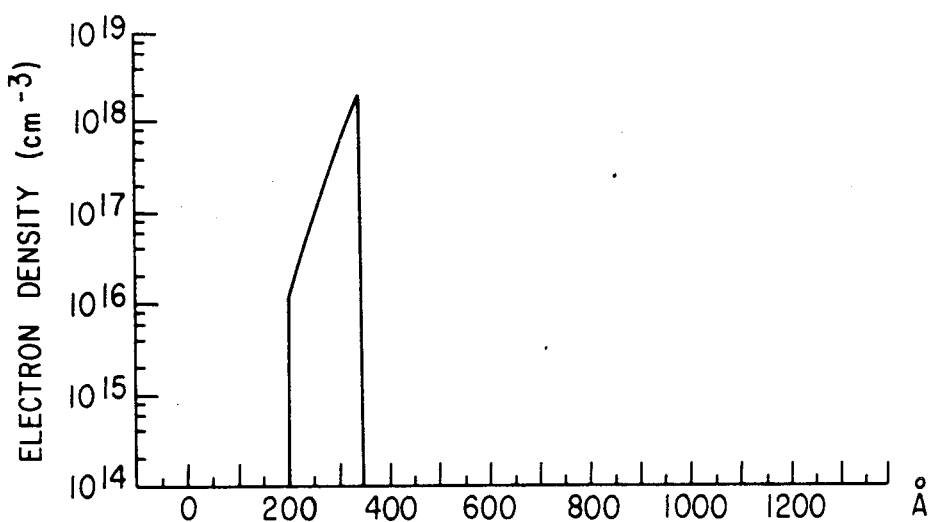

FIGS. 6C-D are the corresponding conduction band edge and electron density for a zero bias; the averaged electron density is:

| Layer | Electron density ($10^{12}/cm^2$) |
|---|---|
| AlGaAs 194 | nil |
| InGaAs 192 | 0.71 |
| AlGaAs 190 | nil |
| AlGaAs 188 | nil |
| Total | 0.71 |

Figure 6E:
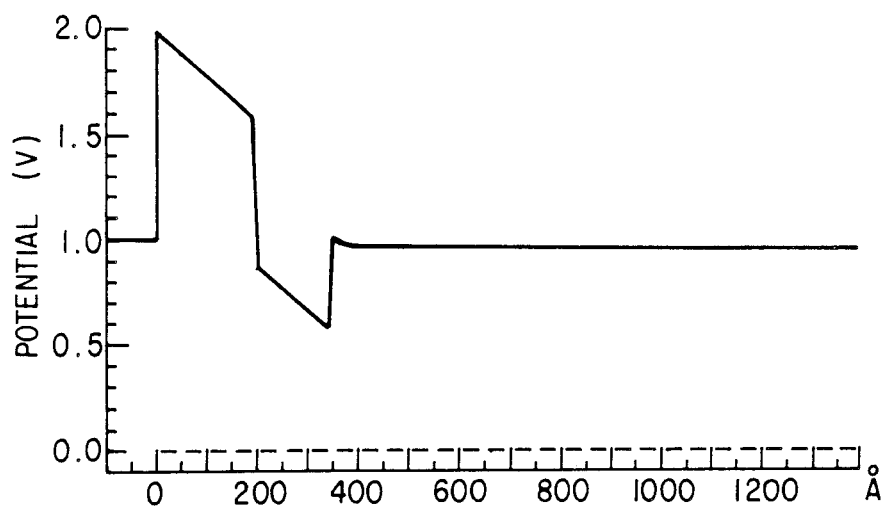
Figure 6F:
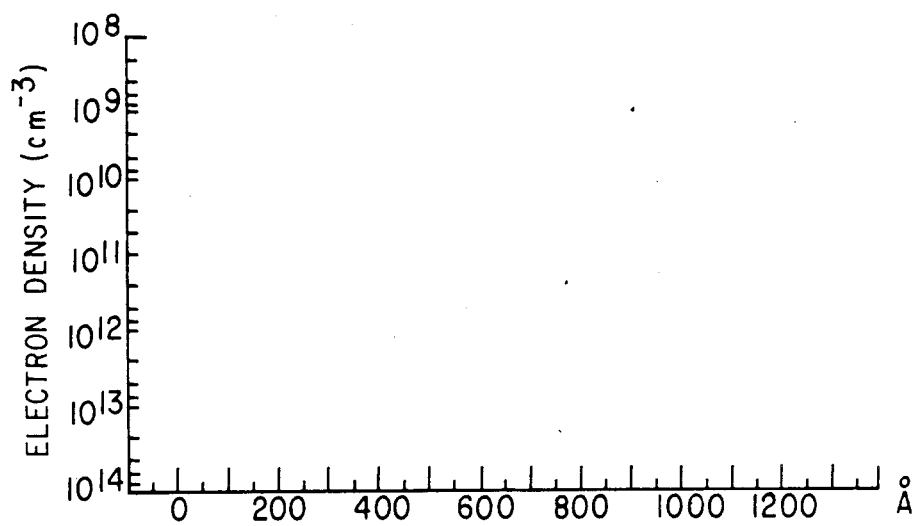

Lastly, FIGS. 6E-F are the corresponding conduction band edge and electron density for a (reverse) bias of −1.0 volt; the electron density is more than ten orders of magnitude smaller than for zero bias and does not even appear in the graph.

A fifth preferred embodiment MISFET 230, illustrated in schematic cross sectional elevation view in FIG. 7, is a variant of MISFET 30 with doped graded layer 38 and doped active layer 36 replaced by an undoped GaAs active layer 236 which is 100 Å thick and a second doped $Al_xGa_{1-x}As$ barrier layer 238. Active layer 236 forms heterojunctions with $Al_xGa_{1-x}As$ barrier layers 238 and 240 and will have a 2DEG at each interface.

A sixth preferred embodiment MISFET 330, illustrated in schematic cross sectional elevation view in FIG. 8, is a variant of MISFET 30 with second doped $Al_xGa_{1-x}As$ barrier layer 338 and doped graded $Al_xGa_{1-x}As$ layer 340 for doped GaAs active layer 336.

MODIFICATIONS AND ADVANTAGES

Various modifications of the preferred embodiment devices and methods may be made while retaining the features of a heterojunction MISFET with a second heterojunction doped barrier for accumulating channel carriers under forward bias but with depleting under reverse bias. For example, the dimensions and shapes may be varied such as interdigitated source, gate, and drain fingers, travelling wave transistor configuration, and vertical channel. Also, the materials may be varied such as GaAs-on-silicon or InP substrate, HgCdTe and CdTe layers, AlInGaAsP and GaAsP layers, and superlattices of AlAs and GaAs or other materials and with graded composition of layers or strained layer superlattices. Further, the doping levels may be varied such as light doping (less than $1 \times 10^{15}/cm^3$) in the channel, graded doping in the barrier or active layers (if any), or undoped buffer layers between the barrier and channel or between the barrier and the active layer. In fact, light doping in the gate insulator is also possible, and the dopings of the various layers may be of both conductivity types; however, the barrier and the active layer (if there is one) must be of the same conductivity type for the gate to control both conduction paths. Also, all p doping with two-dimensional hole gasses may be used with all of the embodiments and variations.

The preferred embodiments have the advantages of high breakdown voltage by use of a widegap gate insulator; high mobility conduction carriers by use of an undoped or very lightly doped channel which lattice matches the insulator and a lattice matched barrier layer which provides modulation doping; large maximum current by accumulation of carriers in the channel under forward bias with high transconductance by limiting conduction in the gate insulator by use of an undoped gate insulator; and high frequency operation by short gates and thin channels.

What is claimed is:

1. A field effect transistor, comprising:
   (a) a channel made of a first semiconductor material, said channel undoped or lightly doped;
   (b) a gate insulator made of a second semiconductor material said insulator on said channel, said second material of wider bandgap than said first material and lattice matched or strained layer matched to said first material, and said insulator undoped or lightly doped;
   (c) a gate on said insulator, said gate separated from said channel by said insulator;
   (d) a barrier made of a third semiconductor material, said barrier on said channel and separated from said insulator by said channel, said third material of wider bandgap than said first material and lattice matched or strained layer matched to said first material, and said barrier at least partially heavily doped; and
   (e) source and drain regions contacting said channel.

2. The transistor of claim 1, wherein:
   (a) said first material is GaAs;
   (b) said second material is $Al_xGa_{1-x}As$; and
   (c) said third material is $Al_yGa_{1-y}As$ and doped n type.

3. The transistor of claim 1, wherein:
   (a) said first material is $In_zGa_{1-z}As$:
   (b) said second material is $Al_xGa_{1-x}As$; and
   (c) said third material is $Al_yGa_{1-y}As$ and doped n type.

4. The transistor of claim 1, further comprising:
   (a) an active layer made of a fourth semiconductor material, said active layer separated from said channel by said barrier, said fourth material of narower bandgap than said third material and lattice matched or strained layer matched to said third material, and said active layer contacting said source and drain regions.

5. The transistor of claim 4, wherein:
   (a) said active layer and said barrier form a heterojunction.

6. The transistor of claim 4, wherein:
   (a) said active layer and said barrier are separated by a graded layer of semiconductor material, said graded layer of composition substantially equal to that of said active layer at the interface of said graded layer and said active layer, of composition substantially equal to that of said barrier at the interface of said graded layer and said barrier, and of composition continuously varying in between the interfaces.

7. The transistor of claim 5, wherein:
(a) said first material is $In_zGa_{1-z}As$;
(b) said second material is $Al_xGa_{1-x}As$;
(c) said third material is $Al_yGa_{1-y}As$ and doped n type: and
(d) said fourth material is GaAs and undoped.

8. The transistor of claim 6, wherein:
(a) said first material is $In_zGa_{1-z}As$;
(b) said second material is $Al_xGa_{1-x}As$;
(c) said third material is $Al_yGa_{1-y}As$ and doped n type;
(d) said fourth material is GaAs and doped n type; and
(e) said graded layer is made of $Al_wGa_{1-w}As$ with w varying linearly with distance from w=0 at the active layer to w=y at the barrier.

9. The transistor of claim 1, wherein:
(a) said channel is made of $In_xGa_{1-x}As$;
(b) said insulator is made of $Al_yGa_{1-y}As$; and
(c) said barrier is made of $Al_zGa_{1-z}As$.

* * * * *